(12) United States Patent
Chen et al.

(10) Patent No.: US 11,839,048 B2
(45) Date of Patent: Dec. 5, 2023

(54) POLE MOUNT SYSTEM FOR FACILITATING INSTALLATION OF HEAVY TELECOMMUNICATIONS EQUIPMENT

(71) Applicant: SUPER MICRO COMPUTER, INC., San Jose, CA (US)

(72) Inventors: Chia-Wei Chen, Taipei (TW); Tienen Chao, San Jose, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 693 days.

(21) Appl. No.: 17/036,250

(22) Filed: Sep. 29, 2020

(65) Prior Publication Data

US 2022/0104384 A1    Mar. 31, 2022

(51) Int. Cl.
| | | |
|---|---|---|
| H05K 7/18 | (2006.01) | |
| F16B 2/06 | (2006.01) | |
| H04Q 1/04 | (2006.01) | |
| H04Q 1/14 | (2006.01) | |

(52) U.S. Cl.
CPC ............. *H05K 7/186* (2013.01); *F16B 2/065* (2013.01); *H04Q 1/04* (2013.01); *H04Q 1/14* (2013.01)

(58) Field of Classification Search
CPC .......... H02G 3/08; H02G 3/081; H05K 7/186; H05K 5/00; H05K 5/02; H05K 5/0204; F16B 2/065; H04Q 1/04; H04Q 1/14; E04H 12/22; E04H 12/2269; E04H 12/2253; H02B 1/50
USPC ....... 174/50, 45 R, 493, 535, 61, 63, 58, 38, 174/40 R; 220/3.3, 3.9, 4.02; 312/223.6, 312/223.1, 237, 351.1; 361/600, 601, 361/724, 752; 248/906
See application file for complete search history.

(56) References Cited

U.S. PATENT DOCUMENTS

| | | | | |
|---|---|---|---|---|
| 4,934,644 A | * | 6/1990 | Nagy | H02G 3/105 248/230.8 |
| 6,185,303 B1 | * | 2/2001 | Losey | A47B 96/06 248/219.4 |
| 6,486,399 B1 | * | 11/2002 | Armstrong | H05K 5/0204 174/58 |
| 6,969,034 B2 | * | 11/2005 | Ware | H01G 2/04 248/230.9 |
| 6,974,908 B2 | * | 12/2005 | White | H02G 3/32 174/53 |
| 7,316,376 B1 | * | 1/2008 | Engler | F16M 11/08 248/548 |
| 8,668,175 B2 | * | 3/2014 | Koleszar | H05K 7/1488 248/122.1 |
| 9,985,422 B2 | * | 5/2018 | Jett | H02B 1/50 |

FOREIGN PATENT DOCUMENTS

| | | |
|---|---|---|
| CN | 110167205 A | 8/2019 |
| CN | 110460914 A | 11/2019 |

* cited by examiner

*Primary Examiner* — Angel R Estrada
(74) *Attorney, Agent, or Firm* — Beyer Law Group LLP

(57) ABSTRACT

A pole mount system has an enclosure, an enclosure mounting assembly, and a clamp system. The enclosure mounting assembly is affixed to the exterior of the enclosure. The clamp system grips the pole. The enclosure mounting assembly and the clamp system have complementary fastening structures to secure the enclosure to the pole.

14 Claims, 6 Drawing Sheets

POLE MOUNT SYSTEM FOR FACILITATING INSTALLATION OF HEAVY TELECOMMUNICATIONS EQUIPMENT

BACKGROUND OF THE INVENTION

1. Field of the Invention

The present invention relates generally to pole mounting devices for telecommunications equipment.

2. Description of the Background Art

The advent and growth of 5G mobile network technology will put increasingly greater demands on currently-existing telecommunications infrastructure. The heavy equipment necessary to support the telecommunications network can be found mounted on buildings, utility poles, and other existing free-standing structures and is often secured outdoors and at higher elevations to minimize network interference and reduce latency. Installing and maintaining such heavy equipment at such heights is dangerous and typically requires at least two workers.

FIG. 1 shows a conventional pole mount system for an enclosure. An enclosure 102 is mounted onto a pole 101 by a plurality of pole clamps. Each pole clamp comprises one mounting bracket 103 affixed to the exterior of the enclosure 102, a complementary bracket 104, and a pair of screws 105. Each bracket comprises at least one opening at each end with a complementary opening on the other bracket. The two brackets are aligned to enclose the pole 101 between them, and the screws 105 are inserted through the aligned openings and tightened until the pole clamp and the attached enclosure 102 is firmly secured to the pole 101.

Due to the size and weight of the enclosure 102 and the height at which the enclosure 102 is installed, the conventional pole mount system requires two workers to install or remove. One worker must support the weight of the server enclosure and maintain its desired position against the pole, while the other worker must align and secure the pole clamps. This doubles labor costs and increases the likelihood of fatigue and injury to both workers, particularly in adverse weather conditions.

SUMMARY

In one embodiment, a pole mount system comprises an enclosure; an enclosure mounting assembly affixed to the exterior of the enclosure; and a clamp system. The enclosure mounting assembly and the clamp system have complementary fastening structures.

In another embodiment, an enclosure is safely mounted to a pole by a single worker by first securing a clamp system to the pole. A primary fastening assembly on the enclosure is then engaged with a corresponding bracket on the clamp system to attach the enclosure to the pole. A secondary fastening assembly on the enclosure is finally engaged with another corresponding bracket on the clamp system to fortify the connection between the enclosure and the pole.

These and other features of the present invention will be readily apparent to persons of ordinary skill in the art upon reading the entirety of this disclosure, which includes the accompanying drawings and claims.

The use of the same reference label in different drawings indicates the same or like components. The drawings are not necessarily to scale.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
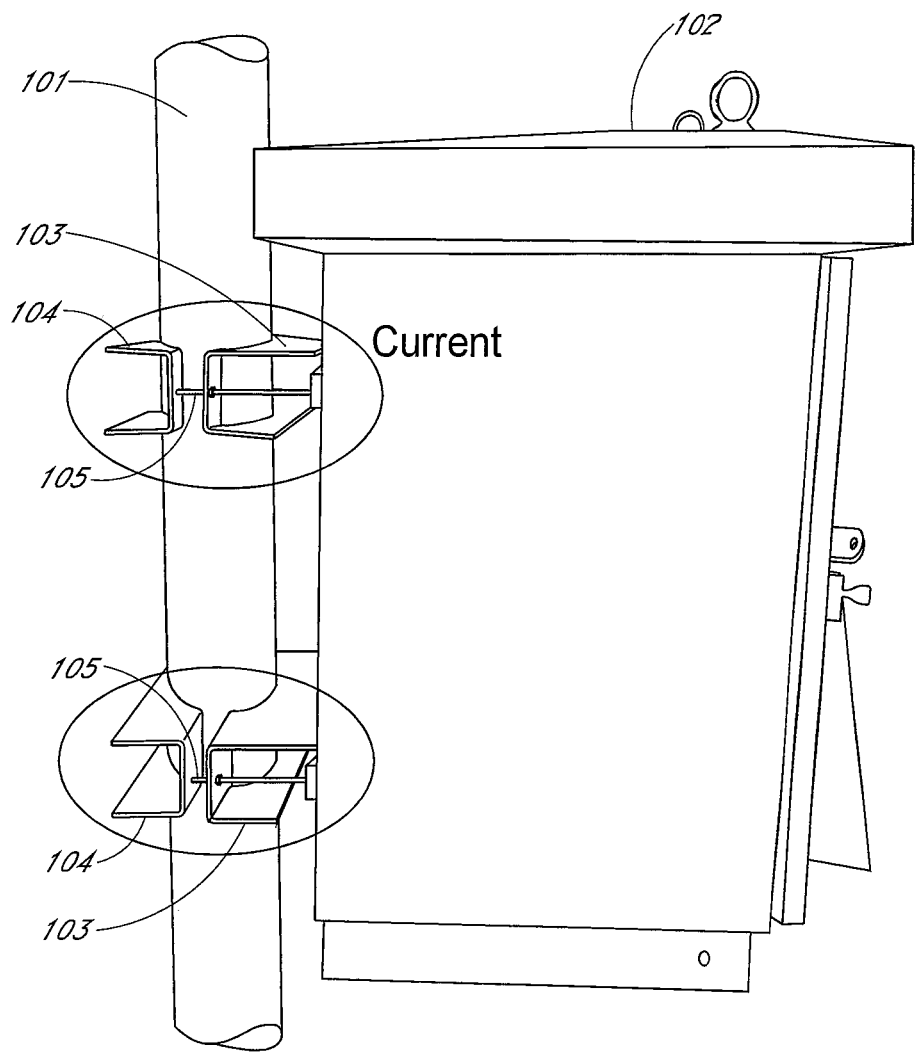
FIG. 1 is a perspective view of a conventional pole mount system.
Figure 2:
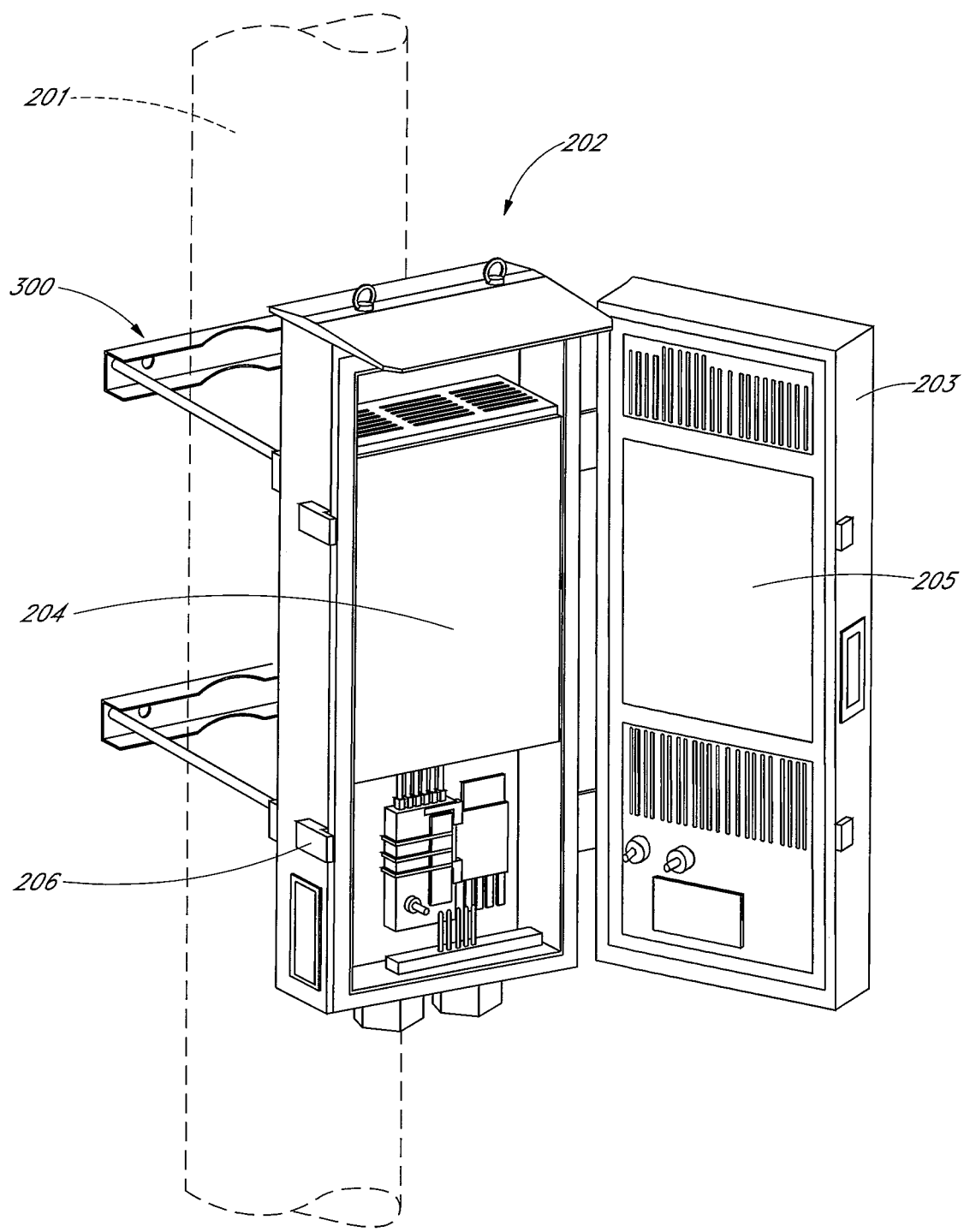
FIG. 2 is a perspective view of a pole mount system in accordance with an embodiment of the present invention.

FIG. 2 is a perspective view of a pole mount system in accordance with an embodiment of the present invention. The pole mount system comprises a server enclosure 202, a clamp system 300 (see FIG. 3), and an enclosure mounting assembly 310 (see FIG. 3). FIG. 2 shows a front part of the server enclosure 202 with an enclosure door 203 opened. In the example of FIG. 2, the server enclosure 202 is mounted onto a telecommunications structure in the form of a pole 201. The clamp system 300 grips the pole 201 at a designated position. The enclosure mounting assembly 310 is located at the rear of the server enclosure 202, opposite the enclosure door 203 and connects the server enclosure 202 to the clamp system 300.

Within the recessed space of the server enclosure 202, a server system 204 is installed. In this depiction, the enclosure door 203 has a recessed space in which a cooling module 205 is installed. The enclosure door 203 opens and closes away from the pole 201 and can be secured by latches 206 without interfering with the clamp system 300. In one embodiment, the server system 204 comprises a computer system for supporting 5G communications, which may comprise computer servers, network switches, 5G modules, antennas, power supplies, batteries, connectors, and cables.

Figure 3:
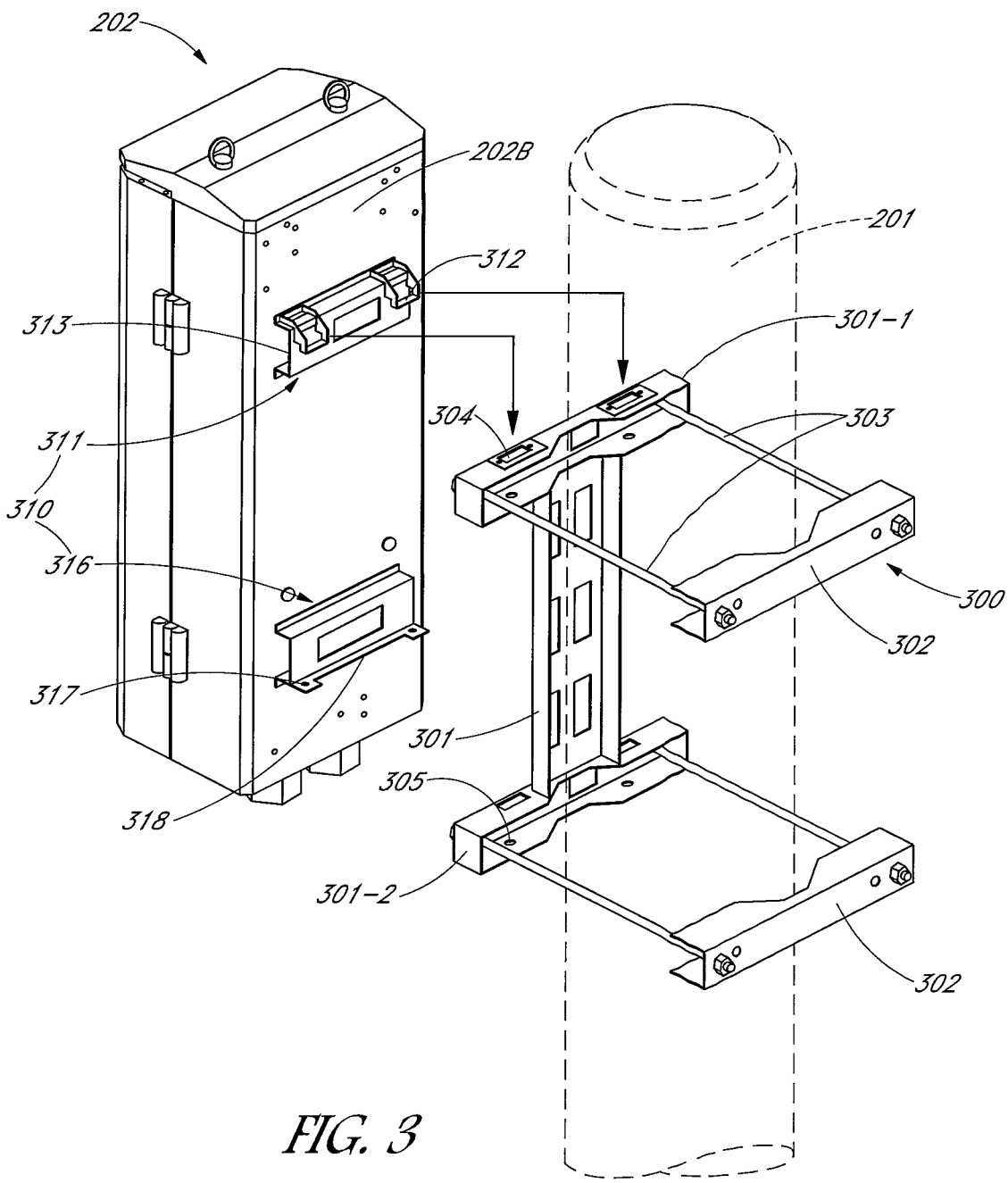
FIG. 3 is another perspective view of the pole system in FIG. 2 in accordance with an embodiment of the present invention.

FIG. 3 is another perspective view of the pole mount system in accordance with an embodiment of the present invention. The pole mount system comprises the server enclosure 202, the clamp system 300, and the enclosure mounting assembly 310. In the example of FIG. 3, the clamp system 300 comprises a first bracket 301-1, a second bracket 301-2, two complementary brackets 302, and four long screws 303 that connect the brackets 301-1 and 301-2 to the complementary brackets 302. In another embodiment, the four long screws 303 may be replaced with other connectors such as straps. In the example of FIG. 3, the first bracket 301-1 and the second bracket 301-2 have been joined to form a single I-shaped main piece 301. The first bracket 301-1 includes one or more openings 304 into which fasteners 312 (e.g., hooks) can be inserted. The second bracket 301-2 includes one or more complementary structures 305

(e.g., holes) for receiving other fasteners 317 (e.g., screws). Each bracket of the main piece 301 has a corresponding complementary bracket 302 positioned on the opposite side of the pole 201. Each bracket of the main piece 301 has at least one opening at each end with a matching opening on the corresponding bracket 302. The two brackets are aligned to enclose the pole 201 between them, and the long screws 303 are inserted through the aligned openings and tightened until the clamp system 300 is mechanically secured to the pole 201. In the example of FIG. 3, the brackets directly contact the surface of the pole 201.

In another embodiment, the clamp system 300 comprises a first bracket 301-1, a second bracket 301-2, and one or more mounting straps (not shown). The first bracket 301-1 and the second bracket 301-2 may be joined to form a single I-shaped main piece 301. The mounting straps are attached to the main piece 301. The mounting straps are wrapped around the pole 201 and can be tightened until the clamp system 300 is mechanically secured to the pole 201.

At least one exterior surface of the server enclosure 202 faces the pole 201. The server enclosure 202 in the example of FIG. 3 is positioned such that the server enclosure's rear exterior surface 202B faces the pole 201. The enclosure mounting assembly 310 is affixed to the rear exterior surface 202B. In the example of FIG. 3, the enclosure mounting assembly 310 comprises a primary fastening assembly 311 and a secondary fastening assembly 316 affixed to the rear exterior surface 202B. The primary fastening assembly 311 comprises one or more fasteners 312 (e.g., hooks) that are inserted into the corresponding openings 304 on the first bracket 301-1. The secondary fastening assembly 316 comprises one or more other fasteners 317, such as screws in the example of FIG. 3, that align with their counterpart structure 305 on the second bracket 301-2. The secondary fastening assembly 316 serves to fortify the connection between the server enclosure 202 and the clamp system 300, further protecting against vertical and lateral slippage. In another embodiment, the primary fastening assembly 311 may be joined to the secondary fastening assembly 316 to form a single unit.

Figure 4:
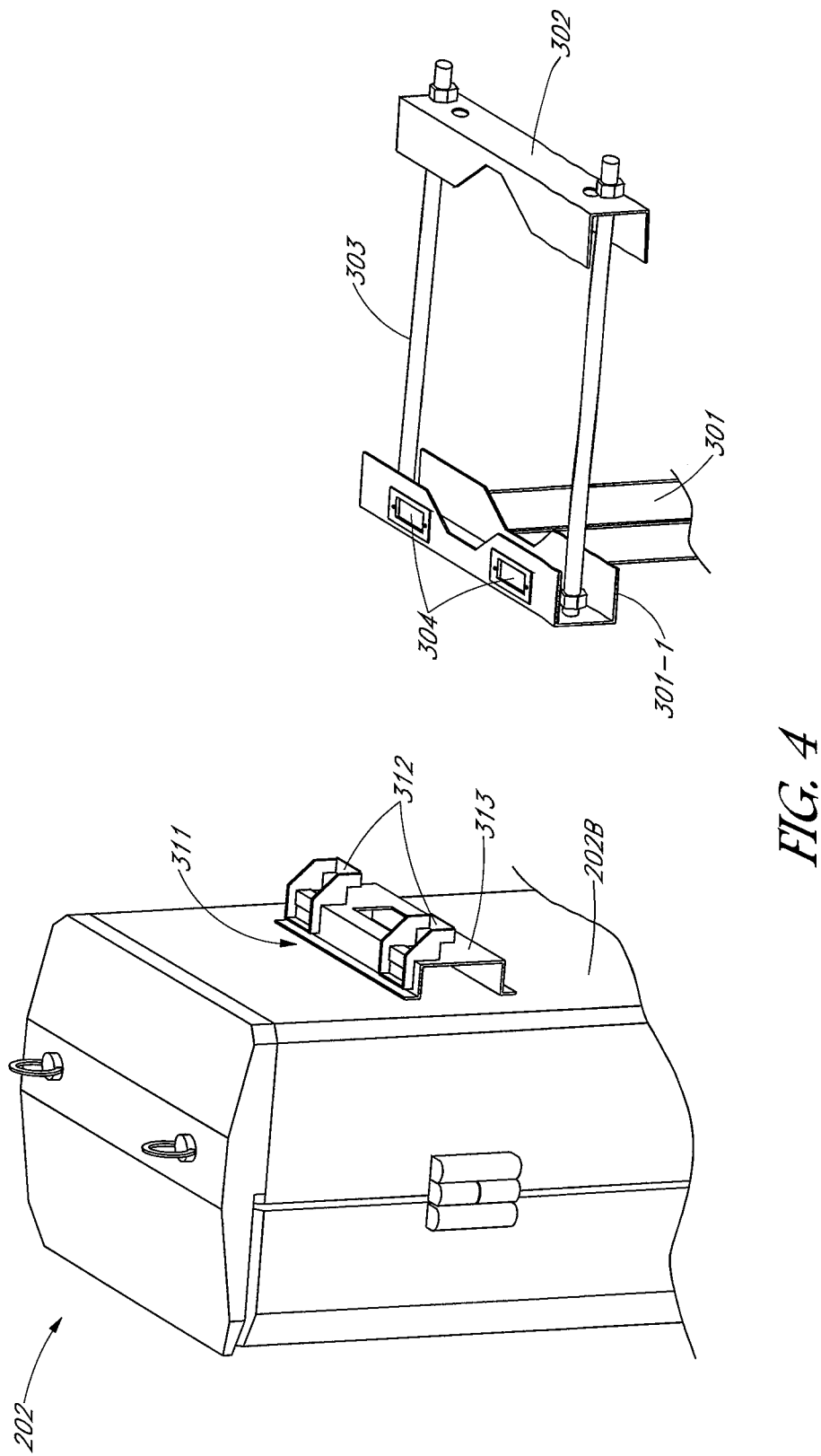
FIG. 4 is a zoom-in view of the upper section of the pole mount system in FIG. 3 in accordance with an embodiment of the present invention.

FIG. 4 is a zoom-in view of the upper section of the pole mount system in FIG. 3 in accordance with an embodiment of the present invention. The primary fastening assembly 311 of the enclosure mounting assembly 310 is affixed to the rear exterior surface 202B of the server enclosure 202. In the example of FIG. 4, the primary fastening assembly 311 comprises a plurality of fasteners 312 in the form of hooks and an optional protruding ledge 313 that facilitates adjusting the distance between the hooks and the surface of the server enclosure 202. In this depiction, screws (not shown) are used to affix the fasteners 312 to the protruding ledge 313 and the protruding ledge 313 to the rear exterior surface 202B.

The first bracket 301-1 of the clamp system 300 contains openings 304 corresponding to the fasteners 312 of the primary fastening assembly 311. In the example of FIG. 4, the fasteners 312 of the primary fastening assembly 311 are hooks, and the corresponding openings 304 are holes such that the hooks can be inserted and engaged to connect the server enclosure 202 to the pole 201. The hooks remain engaged by the force of gravity and the server enclosure 202 is held in place against the pole 201. In another embodiment, the fasteners 312 of the primary fastening assembly 311 are pins.

Figure 5:
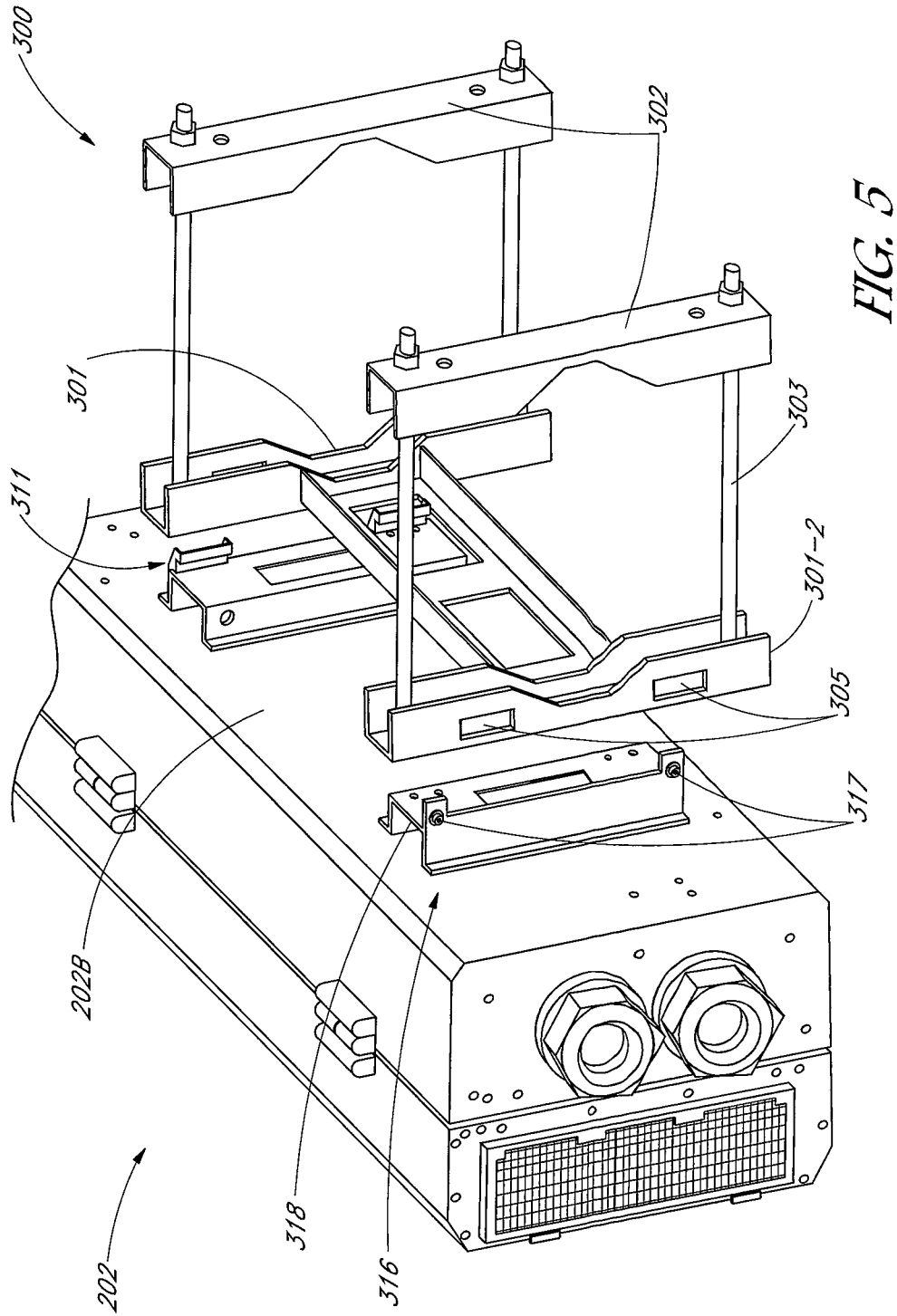
FIG. 5 is a zoom-in view of the lower section of the pole mount system in FIG. 3 in accordance with an embodiment of the present invention.

FIG. 5 is a zoom-in view of the lower section of the pole mount system in FIG. 3 in accordance with an embodiment of the present invention. The secondary fastening assembly 316 is affixed to the rear exterior surface 202B of the server enclosure. In the example of FIG. 5, the secondary fastening assembly 316 comprises a protruding tray 318 and a plurality of fasteners 317 in the form of screws that align with complementary structures 305 in the form of holes on the second bracket 301-2 of the clamp system 300. In this embodiment, the secondary fastening assembly 316 is positioned such that it can be secured to the secondary bracket 301-2 from below after the primary fastening assembly 311 has been engaged with the first bracket 301-1 of the clamp system 300.

The second bracket 301-2 of the main piece 301 of the clamp system 300 contains complementary structures 305 corresponding to the fasteners 317 of the secondary fastening assembly 316. In the example of FIG. 5, the fasteners 317 are screws, and the complementary structures 305 are holes through which the screws can be inserted. In another embodiment, the fasteners 317 are latches and the complementary structures 305 are holes.

Figure 6:
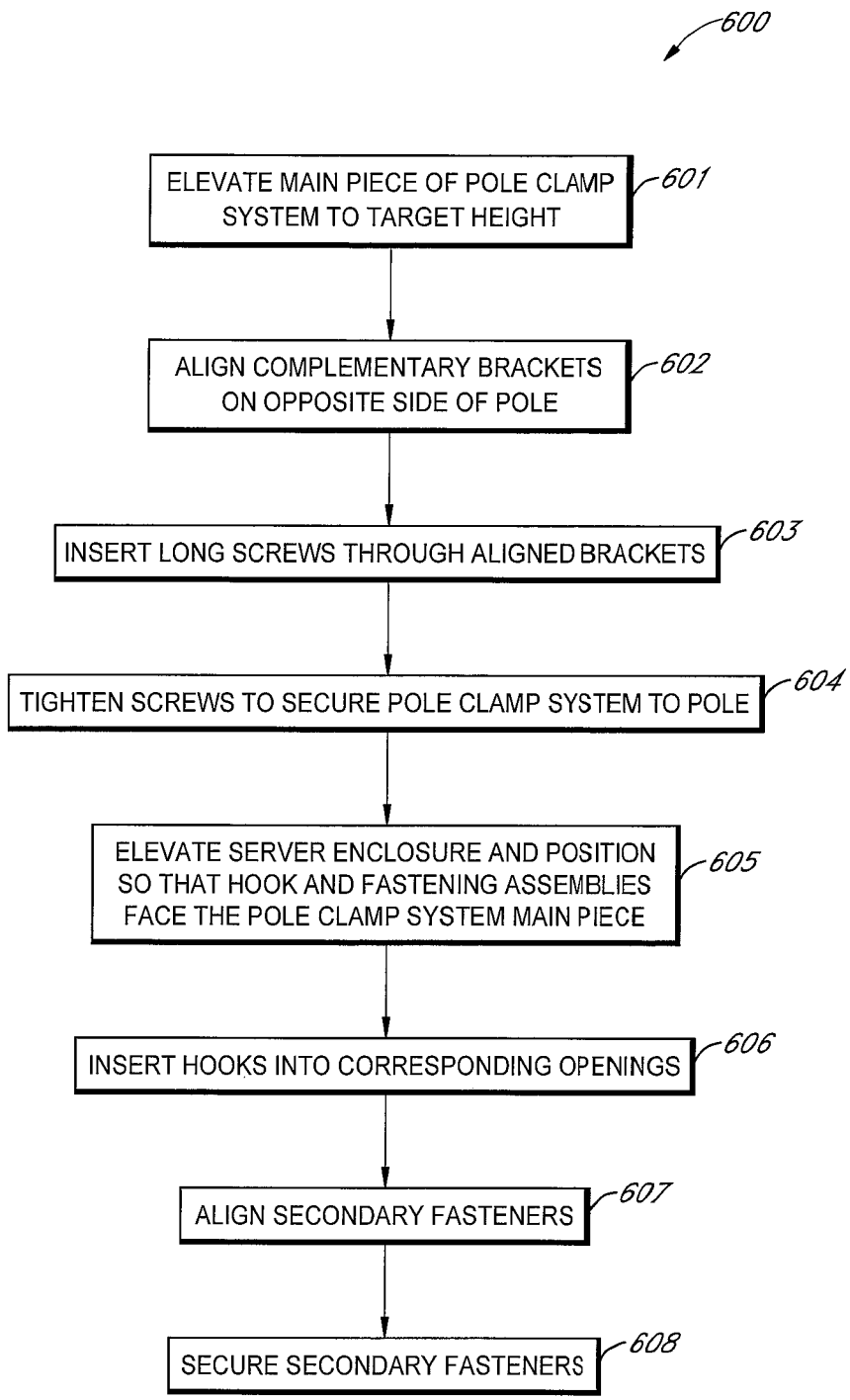
FIG. 6 is a flow diagram of a method of installing a server enclosure in accordance with an embodiment of the present invention.

FIG. 6 is a flow diagram of a method 600 of mounting a server enclosure to a pole in accordance with an embodiment of the present invention. The method 600 is explained using the above-described components for illustration purposes.

In the example of FIG. 6, the main piece 301 of the clamp system 300 is elevated to the desired height against the pole 201 (step 601). For each bracket in the main piece 301, the corresponding complementary bracket 302 is positioned opposite thereto to enclose the pole 201 so that openings on the complementary bracket are aligned with those on the main piece bracket 301 (step 602). Connectors such as long screws 303 are inserted through the aligned openings to connect the brackets (step 603) and then tightened to firmly secure the clamp system 300 to the pole 201 (step 604). Thereafter, the server enclosure 202 is elevated and positioned such that the primary fastening assembly 311 and secondary fastening assembly 316 are facing the clamp system main piece 301 (step 605). The fasteners 312 of the primary fastening assembly 311 are engaged with the corresponding openings 304 of the main piece 301 such that the server enclosure 202 remains connected to the clamp system 300 by the force of gravity (step 606). The secondary fastening assembly 316 is aligned with the complementary structures 305 on the main piece 301 (step 607) and the fasteners 317 are secured to prevent slippage (step 608). As can be appreciated, in the method 600, the clamp system 300 may be attached to the pole 201 by a single worker, as in steps 601-604. Thereafter, the same worker may attach the server enclosure 202 to the clamp system 300 as in steps 605-608. A single worker may thus safely install the enclosure 202 onto the pole 201.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A pole mount system comprising:
   an enclosure;
   an enclosure mounting assembly that is affixed to an exterior surface of the enclosure, the enclosure mounting assembly comprising a primary fastening assembly that comprises a first set of fasteners and a secondary fastening assembly that comprises a protruding tray; and
   a clamp system comprising a first pole bracket that comprises a plurality of holes that engage the first set of fasteners from above the first pole bracket, a second pole bracket, a first complementary bracket, a second complementary bracket, a first set of long screws that connect the first pole bracket to the first complementary bracket, and a second set of long screws that connect the second pole bracket to the second complementary bracket, wherein a second set of fasteners go through a plurality of holes in the protruding tray and through a plurality of holes in the second pole bracket.

2. The pole mount system of claim 1, wherein the enclosure contains a server system for telecommunications.

3. The pole mount system of claim 1, wherein the enclosure mounting assembly is affixed to the a rear exterior surface of the enclosure.

4. The pole mount system of claim 1, wherein the first set of fasteners of the primary fastening assembly are hooks.

5. The pole mount system of claim 1, wherein the first set of fasteners of the primary fastening assembly are pins.

6. The pole mount system of claim 1, wherein the primary fastening assembly further comprises a protruding ledge to which the first set of fasteners are affixed.

7. The pole mount system of claim 1, wherein the second set of fasteners are screws.

8. The pole mount system of claim 1, wherein the first pole bracket and the second pole bracket of the clamp system are joined into a single unit.

9. The pole mount system of claim 1, wherein the brackets of the clamp system directly contact the pole.

10. A method of mounting an enclosure to a pole, the method comprising:
    securing a clamp system to the pole;
    after securing the clamp system to the pole, engaging, from above a first pole bracket of the clamp system, primary fasteners affixed to the enclosure to a plurality of holes of the first pole bracket; and
    after engaging the primary fasteners to the plurality of holes of the first pole bracket, engaging secondary fasteners through a plurality of holes in a second pole bracket of the clamp system and through a plurality of holes in a protruding tray affixed to the enclosure.

11. The method of claim 10, wherein the enclosure contains a server system for telecommunications.

12. The method of claim 10, wherein the primary fasteners are hooks.

13. The method of claim 10, wherein the primary fasteners are pins.

14. The method of claim 10, wherein the secondary fasteners are screws.

* * * * *